(12) United States Patent
Arney et al.

(10) Patent No.: US 8,542,489 B2
(45) Date of Patent: Sep. 24, 2013

(54) MECHANICALLY-REATTACHABLE LIQUID-COOLED COOLING APPARATUS

(75) Inventors: Susanne Arney, Highland Park, NJ (US); Jen-Hau Cheng, New Providence, NJ (US); Paul R. Kolodner, Hoboken, NJ (US); Krishna-Murty Kota-Venkata, Springfield, NJ (US); William Scofield, Batavia, IL (US); Todd R. Salamon, New Providence, NJ (US); Maria E. Simon, New Providence, NJ (US)

(73) Assignee: Alcatel Lucent, Paris (FR)

( * ) Notice: Subject to any disclaimer, the term of this patent is extended or adjusted under 35 U.S.C. 154(b) by 214 days.

(21) Appl. No.: 13/101,509

(22) Filed: May 5, 2011

(65) Prior Publication Data
US 2012/0281359 A1 Nov. 8, 2012

(51) Int. Cl.
*H05K 7/20* (2006.01)
(52) U.S. Cl.
USPC ............ 361/701; 361/679.47; 361/679.53; 361/688; 361/699; 361/700; 165/80.2; 165/80.4; 165/104.14; 165/104.26; 165/104.33; 165/185; 62/259.2
(58) Field of Classification Search
USPC ............. 361/679.46, 679.47, 679.53, 679.54, 361/688, 689, 698, 699–714, 715–727; 165/104.26, 104.33, 80.2, 104.21, 80.4, 165/185, 104.14; 257/714; 62/259.2; 312/223.2, 223.3
See application file for complete search history.

(56) References Cited

U.S. PATENT DOCUMENTS

| | | | | |
|---|---|---|---|---|
| 4,366,526 A * | 12/1982 | Lijoi et al. | | 361/700 |
| 5,329,425 A * | 7/1994 | Leyssens et al. | | 361/701 |
| 5,946,191 A * | 8/1999 | Oyamada | | 361/700 |
| 6,310,772 B1 * | 10/2001 | Hutchison et al. | | 361/700 |
| 6,377,453 B1 * | 4/2002 | Belady | | 361/679.47 |
| 6,643,132 B2 * | 11/2003 | Faneuf et al. | | 361/700 |
| 6,676,221 B2 * | 1/2004 | O'Daniel | | 298/17 SG |
| 6,796,372 B2 * | 9/2004 | Bear | | 165/104.21 |
| 6,828,675 B2 * | 12/2004 | Memory et al. | | 257/714 |
| 6,829,142 B2 * | 12/2004 | Belady et al. | | 361/679.47 |
| 6,927,980 B2 * | 8/2005 | Fukuda et al. | | 361/700 |
| 7,403,384 B2 * | 7/2008 | Pflueger | | 361/688 |
| 7,626,820 B1 * | 12/2009 | Konshak et al. | | 361/700 |
| 7,826,217 B2 * | 11/2010 | Kondo et al. | | 361/679.53 |
| 7,832,462 B2 | 11/2010 | Basavanhally et al. | | |
| 7,839,640 B2 * | 11/2010 | Hayashi et al. | | 361/699 |

(Continued)

OTHER PUBLICATIONS

McCluskey, F. Patrick, et al., "High Temperature Electronics", Passive Techniques for Low (<5 W/cm2) Power Dissipation Applications, (1996), 2 pages.

*Primary Examiner* — Michail V Datskovskiy
(74) *Attorney, Agent, or Firm* — Hitt Gaines, PC (57) ABSTRACT

An apparatus comprising a rack having a row of shelves, each shelf supporting an electronics circuit board, each one of the circuit boards being manually removable from the shelve supporting the one of the circuit boards and having a local heat source thereon. The apparatus also comprises a cooler attached to the rack and being able to circulate a cooling fluid around a channel forming a closed loop. The apparatus further comprises a plurality of heat conduits, each heat conduit being located over a corresponding one of the circuit boards and forming a path to transport heat from the local heat source of the corresponding one of the circuit boards to the cooler. Each heat conduit is configured to be manually detachable from the cooler or the circuit board, without breaking a circulation pathway of the fluid through the cooler.

20 Claims, 8 Drawing Sheets

(56) References Cited

U.S. PATENT DOCUMENTS

| | | | |
|---|---|---|---|
| 7,936,560 B2 * | 5/2011 | Toyoda et al. | 361/679.52 |
| 7,957,144 B2 * | 6/2011 | Goettert et al. | 361/699 |
| 7,978,472 B2 * | 7/2011 | Campbell et al. | 361/699 |
| 8,164,901 B2 * | 4/2012 | Neudorfer | 361/699 |
| 8,164,902 B2 * | 4/2012 | Matsushima et al. | 361/700 |
| 8,305,754 B2 * | 11/2012 | Wu et al. | 361/688 |
| 2005/0083657 A1 | 4/2005 | Hamman | |
| 2006/0060328 A1 | 3/2006 | Ewes et al. | |
| 2007/0291452 A1 * | 12/2007 | Gilliland et al. | 361/699 |
| 2007/0297136 A1 * | 12/2007 | Konshak | 361/699 |
| 2008/0013283 A1 * | 1/2008 | Gilbert et al. | 361/715 |
| 2008/0024992 A1 * | 1/2008 | Pflueger | 361/705 |
| 2009/0027856 A1 * | 1/2009 | McCoy | 361/699 |
| 2009/0188264 A1 | 7/2009 | Fair et al. | |
| 2009/0225515 A1 * | 9/2009 | Hom et al. | 361/701 |
| 2009/0242036 A1 | 10/2009 | Kolodner et al. | |
| 2010/0230079 A1 | 9/2010 | Byers et al. | |
| 2012/0050986 A1 * | 3/2012 | Riebel | 361/679.48 |

* cited by examiner

MECHANICALLY-REATTACHABLE LIQUID-COOLED COOLING APPARATUS

ACKNOWLEDGEMENT OF GOVERNMENT SUPPORT

The U.S. Government has a paid-up license to the subject matter of this application and the right in limited circumstances to require the patent owner to license others on reasonable terms as provided for by the terms of Grant No. DE-EE0002895 awarded by the U.S. Department of Energy.

TECHNICAL FIELD

The present invention is directed, in general, to a cooling apparatus and, more specifically, to a cooling apparatus used to cool rack-mounted telecommunications or other data circuit boards and methods for operating and manufacturing the same.

BACKGROUND OF THE INVENTION

Electronic components generate heat which must be dissipated; otherwise the components operate at too high a temperature, which can lead to premature failure and diminished long-term reliability. Thermal management issues are becoming increasingly important as the higher capacity and functionality of each new generation of communications products often translates directly into increased device power and the associated heat dissipation challenges.

Often in electronics cooling applications, air is used as the primary medium for the cooling of heat-dissipating components. In a typical configuration, a heat sink is attached to the heat generating component and fans supply a flow of air past the heat sink to provide cooling.

Some problems with this approach include: the need for increasingly larger heat sinks to cool the higher heat densities in current and next-generation equipment; limitations on further improving existing air-cooled heat sink performance; and acoustic noise limits, fan reliability considerations and fan power requirements associated with increasing the volume of air flow through the heat sink.

SUMMARY

One embodiment includes an apparatus. The apparatus comprises a rack having a row of shelves, each shelf supporting an electronics circuit board, each one of the circuit boards being manually removable from the shelve supporting the one of the circuit boards and having a local heat source thereon. The apparatus also comprises a cooler attached to the rack and being able to circulate a cooling fluid around a channel forming a closed loop. The apparatus further comprises a plurality of heat conduits, each heat conduit being located over a corresponding one of the circuit boards and forming a path to transport heat from the local heat source of the corresponding one of the circuit boards to the cooler. Each heat conduit is configured to be manually detachable from the cooler or the circuit board, without breaking a circulation pathway of the fluid through the cooler.

Another embodiment is another apparatus. The apparatus comprises a rack having a row of electronics circuit boards, each circuit board having a corresponding local heat source thereon. The apparatus also comprises a cooler and a plurality of heat conduits. The cooler is located on a side of the rack and is configured to circulate a cooling fluid in a channel having a plurality of channel segments. Each heat conduit is removably clamped around corresponding one of the channel segments and has a portion adjacent to the localized heat source on a corresponding one of the circuit boards.

Still another embodiment is a method of assembling an apparatus. The method comprises providing a rack having a row of shelves, each shelf supporting an electronics circuit board. The method also comprises installing an electronics circuit board on one of the shelves, each one of the circuit boards being mechanically removable from the shelve supporting the one of the circuit boards and having a local heat source. The method further comprises attaching a cooler to the rack, the cooler being able to circulate a cooling fluid around a channel forming a closed loop. The method also comprise providing a plurality of heat conduits, each heat conduit located over a corresponding one of the circuit boards and forming a path to transport heat from the local heat source of the corresponding one of the circuit boards to the cooler. Each heat conduit is configured to be manually detachable from the cooler or the circuit board, without breaking a circulation pathway of the fluid through the cooler.

BRIEF DESCRIPTION OF THE DRAWINGS

The embodiments of the disclosure are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which.

DETAILED DESCRIPTION

The description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

Embodiments of the present disclosure benefit from the recognition that the use of fluid-cooling can facilitate the dissipation of higher heat densities within equipment racks than is currently possible using traditional air-cooling approaches. Fluid-cooling, in turn, has a number of benefits: the use of higher component densities on circuit boards resulting in space savings; reduced cost energy usage and improved reliability due to the reduction or elimination of fans; and reduction or elimination of the need for less energy efficient air-conditioning-based approaches.

The use of fluid-cooling, however, requires avoiding the fluid leaks or spills, either during normal operations or when replacing a circuit board, that could damage the circuit boards. The cooling fluid is often a commercial grade refrigerant whose vapors pose a suffocation risk. Flash evaporation of leaked fluid also poses the danger of skin burns. Embodiments of the present disclosure address this problem by providing mechanically detachable features that permit the replacement of circuit boards without breaking a cooling fluid circulation pathway.

Figure 1:
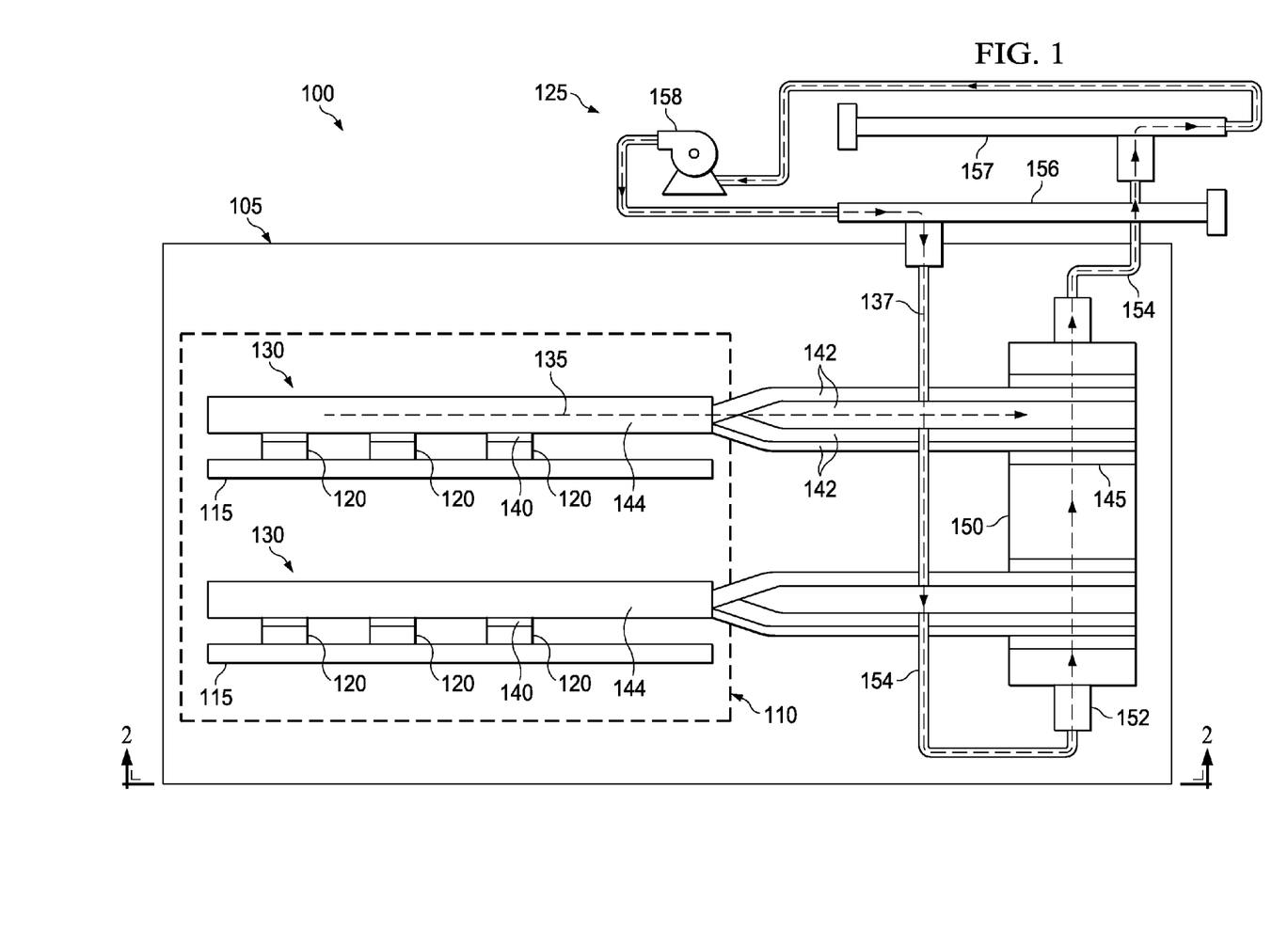
FIG. 1 presents a plan view of an example apparatus of the present disclosure.
Figure 2:
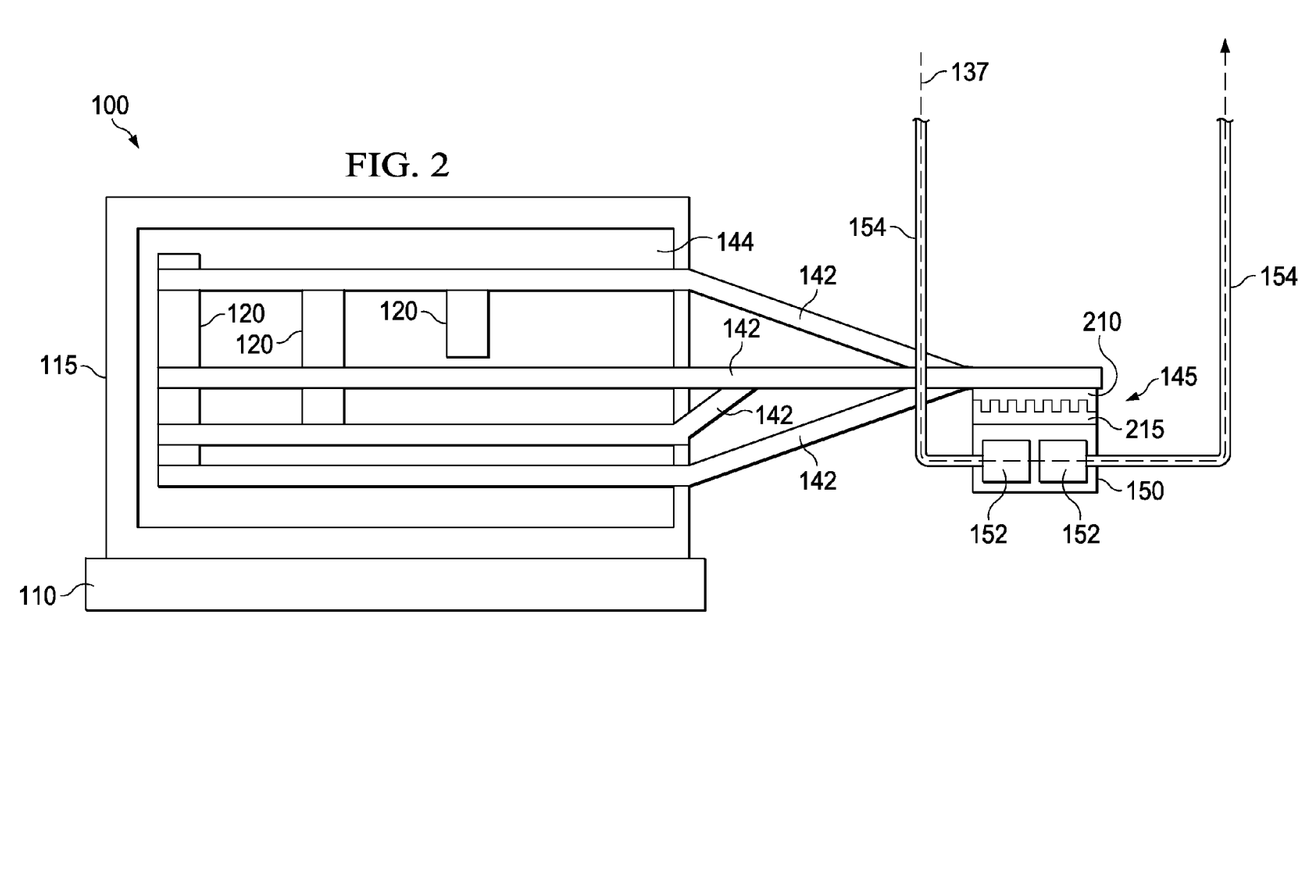
FIG. 2 presents a side view of a portion of the example apparatus along view line 2 shown in FIG. 1.

One embodiment of the disclosure is an apparatus. FIG. 1 presents a plan view of an example apparatus 100 of the present disclosure and FIG. 2 presents a side view of a portion of the example apparatus 100 along view line 2 shown in FIG. 1.

The apparatus 100 comprises a rack 105 having a row of shelves 110, each shelf 110 supporting one or more electronics circuit boards 115 (including, e.g., circuit packs or blade servers). Each one of the circuit boards 115 is manually removable from the shelve 110 supporting the one of the circuit boards 115 and having a local heat source 120 thereon.

The apparatus also comprises a cooler 125 to the rack 105 and being able to circulate a cooling fluid around a channel forming a closed loop.

The apparatus 100 also comprises a plurality of heat conduits 130, each heat conduit 130 being located over a corresponding one of the circuit boards 115 and forming a path 135 to transport heat from the local heat source 120 of the corresponding one of the circuit boards 115 to the cooler 125. Each heat conduit 130 is configured to be manually detachable (e.g., mechanically detachable) from the cooler 125 or the circuit board 115, without breaking a circulation pathway 137 through the cooler 125 (e.g., fluid circulating through pipes or channels therein).

In some embodiments, the cooling fluid is a single-phase liquid that transfers heat primarily through sensible heat associated with a temperature increase of the liquid. In other embodiments, the cooling fluid is a two-phase liquid that transfers heat primarily by phase change, e.g., vaporization/boiling of the liquid to a vapor. Example embodiments of the cooling fluid include refrigerants (e.g., R134a or water) or dielectric liquids. In some cases, for example the cooling fluid can be a two-phase refrigerant, and the temperature at which it evaporates is controlled by the operating pressure of the cooler 125, with the temperature chosen to always be above the dew point associated with the humidity levels within the room where the cooler 125 operates. The embodiments of fluid include a single-phase or two-phase liquid or a mixture/combination of two or more miscible or immiscible liquids (for example, dielectric fluids, alcohols, refrigerants, water to name a few) or a dispersion (for example, slurry(ies) of a liquid and nano/micro/macro encapsulated/free solid/semi-solid particles that may as well change the phase between solid and liquid states if required) or a liquid metal. The fluid, depending on the application requirements, can have either a unidirectional (circulating in a loop from the hot to the cold end and vice versa) or bidirectional (oscillating between the hot and cold ends) motion.

In some cases, the heat conduit 130 can be fixed to the heat source 120 on the circuit board 115, but be mechanically detachable from the cooler 125. In other cases, the heat conduit 130 can be fixed to the cooler 125, but be mechanically detachable from the heat source 120. In still other cases, the heat conduit 130 can be mechanically detachable from both the heat source 120 and the cooler 125.

In some cases, the heat conduit 130 can be coupled to the localized heat source 120 by a localized thermal interface 140 and can be either permanently fixed or detachable.

Examples of suitable materials for a fixed thermal interface 140 include epoxy or solder. Examples of suitable materials for a detachable thermal interface include solid-liquid phase change material pads.

To facilitate the ability to replace the circuit boards 115 without breaking the cooling fluid circulation pathway 137, embodiments of the heat conduit 130 can be constructed to not exchange the cooling fluid with the cooler 125. For example, in some embodiment the heat conduit 130 can include one or more heat pipes 142, including assemblies thereof. A portion the heat pipe 142 (or assemblies thereof) can be held inside of an outer shell 144 (e.g., a metal block integrated with heat pipes) of the heat conduit 130. The heat pipe 142 (and/or heat spreader) can form at least part of the path 135 to transport heat from the local heat sources 120 to the cooler 125. In some embodiments, for example, the heat conduits 130 can be configured to transport heat to a localized thermal interface 145 of the cooler 125.

In some embodiments, such as shown in FIGS. 1-2, the heat conduit 130 (e.g., one or more heat pipes 142) contacts a micro-channeled heat exchanger 150 of the cooler 125. As illustrated, the micro-channeled heat exchanger 150 can be in fluid communication with other components of the cooler 125, such as fluid connectors 152, fluid lines 154, supply and return manifolds 156, 157 and pumps 158. The micro-channeled heat exchanger 150 is not in fluid communication with the heat pipes 142. In some cases, the connectors 152 are brazed onto the other components (e.g., micro-channeled heat exchanger 150 and fluid lines 154) to thereby providing a closed fluid circulation pathway 137 that is less prone to leakage or loss of cooling fluid.

In some cases, the mechanically detachable connection of the heat conduit 130 to the localized thermal interface 145 at the cooler 125 can include any of the heat transfer devices described in U.S. patent application Ser. No. 10/946,571 to Ewes et al., filed Sep. 21, 2004, which is incorporated by references herein in its entirety. For example, one of the heat conduits 130 and the localized thermal interface 145 can form a structure having interleaved metal fins, and the one of the heat conduits 130 can be manually detachable from the localized thermal interface 145.

For example, in some cases, such as illustrated in FIG. 2, one finned heat sink coupler 210 is fixed to the heat conduit 130 (e.g., a heat pipe 142) and another finned heat sink coupler 215, as part of the thermal interface 145, is fixed to the micro-channeled heat exchanger 150. The finned heat sink couplers 210, 215 are configured to interleave with each other by sliding the finned portions relative to each other, such as described in the U.S. patent application Ser. No. 10/946,571.

Similarly, in some embodiments, the localized thermal interface 140 between the heat conduit 130 and the localized heat source 120 can be mechanically detachable, and include any of the heat transfer devices described in the U.S. patent application Ser. No. 10/946,571, such as the above-described finned heat sink couplers.

FIGS. 3-6 presents plan views of alternative configurations of the example apparatus 100 of the present disclosure, analogous to the view presented in FIG. 1. For clarity certain features of the apparatus (e.g., the rack, shelves and some components of the cooler) are not depicted.

Figure 3:
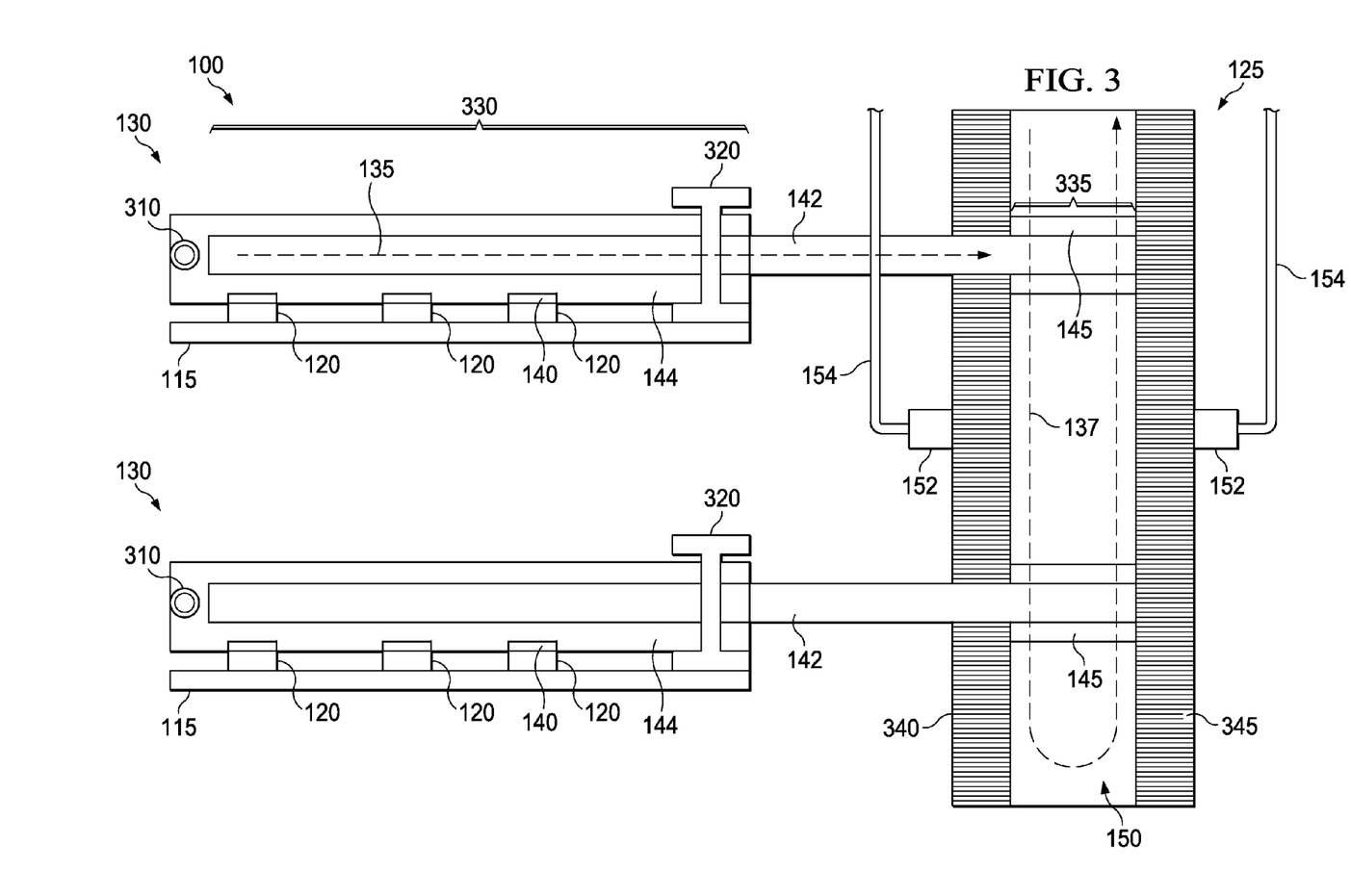
FIG. 3 presents a plan view of another example apparatus of the present disclosure.

As illustrated in FIG. 3, in some embodiments of the apparatus 100, each heat conduit 130 has a hinge 310 that facilitates an outer shell 144 of a heat conduit 130 (and/or heat spreader) to removably clamp (e.g., in some cases being held in place using a clamp 320) around a portion 330 of the heat pipe 142 (and/or heat spreader), and another portion 335 of the heat pipe (and/or heat spreader) is mechanically attached (e.g., permanently or removably) to the cooler 125 (e.g., via the localized thermal interface 145 of the cooler 125). The use of a hinged outer shell 144 facilitates efficient thermal contact between the outer shell 144 and the heat pipe 142 well as the detachability of the heat pipe 142. As illustrated in FIG. 3, in some embodiments, the localized thermal interface 145 can be coupled to a micro-channel heat exchanger 150, which in turn can be coupled to a cooling fluid inlet plenum 340 and outlet plenum 345.

Figure 4:
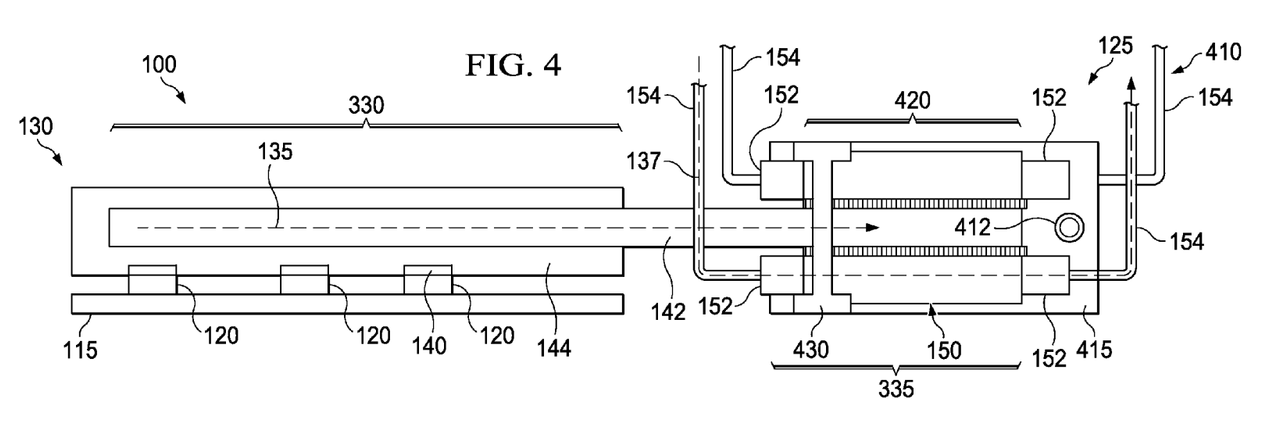
FIG. 4 presents a plan view of another example apparatus of the present disclosure.
Figure 5:
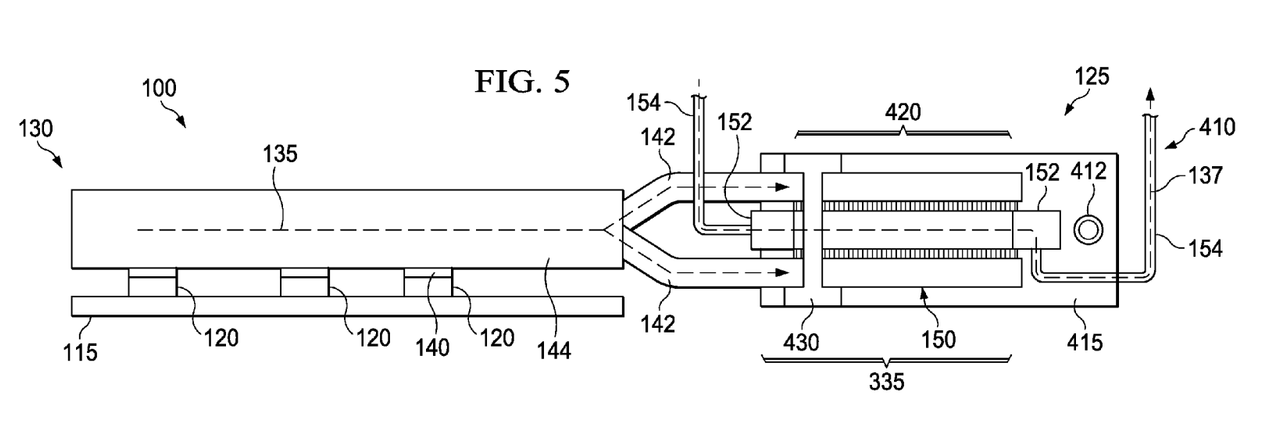
FIG. 5 presents a plan view of another example apparatus of the present disclosure.

As illustrated in FIGS. 4 and 5, some embodiments of the apparatus 100 further include, a second heat conduit 410 having a hinge 412 that enables an outer shell 415 of the second heat conduit 410 to clamp around a portion 420 of the cooler 125 (e.g., portions of one or more micro-channel channel heat exchangers 150 of the cooler 125) and around portion 335 of a heat pipe 142 (and/or heat spreader) the heat conduit 130. Another portion 330 of the heat pipe 142 (and/or heat spreader) is mechanically attached to the heat conduit 130 similar to that shown in FIG. 3. For example, as shown in FIG. 4, in some cases, to facilitate efficient heat transfer and detachability, one or more heat pipes 142 (and/or heat spreader) can be clamped between two heat exchangers 150 by the second heat conduit 410 as facilitated using a clamp 430. In some cases, for example, the micro-channel heat exchangers 150 can be permanently fixed to the outer shell 415.

In alternative embodiments, however, as shown in FIG. 5, to facilitate efficient heat transfer and detachability, a single micro-channel heat exchanger 150 can be clamped between two or more heat pipes 142.

Figure 6:
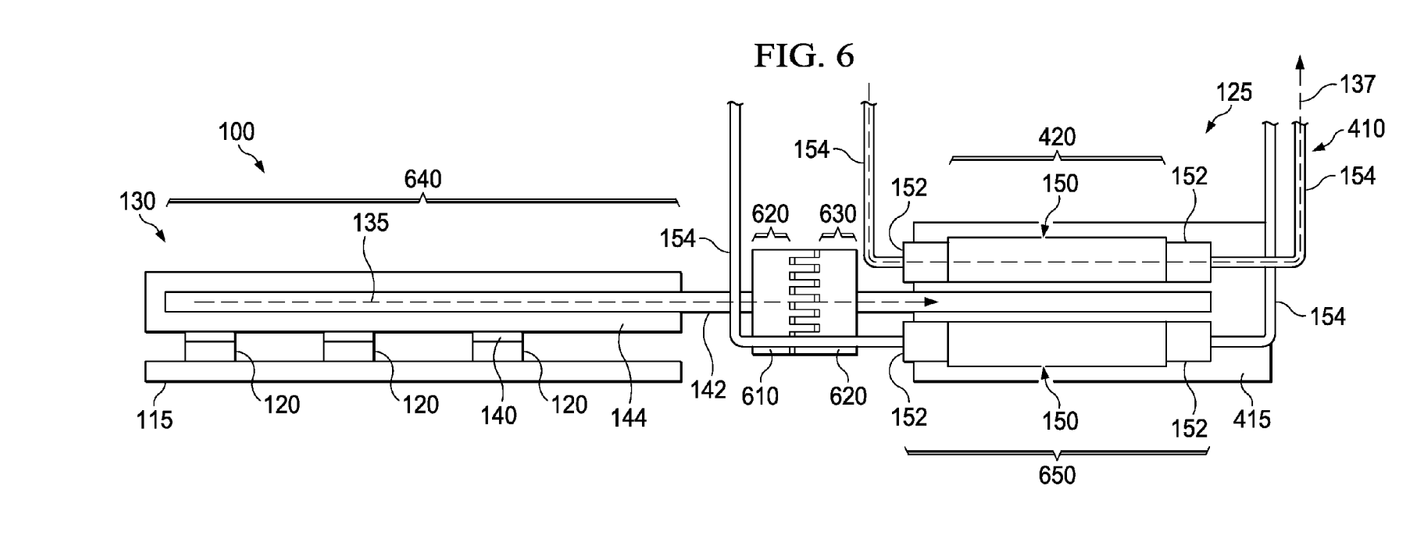
FIG. 6 presents a plan view of another example apparatus of the present disclosure.

As shown in FIG. 6, in still other embodiments of the apparatus 100, the second heat conduit 410 can have a mechanically detachable localized thermal interface 145 with the heat conduit 130. For instance, the localized thermal interface 145 can include one finned heat sink coupler 610 fixed to a portion 620 of the heat conduit 130 (e.g., a heat pipe 142) and another finned heat sink coupler 620 fixed to a portion 630 of the second heat conduit 410 (e.g., heat pipe 635), where the finned heat sink couplers 610, 620 are configured to interleave with each other by sliding the finned portions relative to each other. In some cases, the localized thermal interface 145 can additionally or alternatively include one or more microchannel heat exchangers. For example, microchannel heat exchangers could be integrated into each or the finned heat sink couplers 610, 620. Similar to that described for embodiments shown in FIG. 4, another portion 640 of the heat pipe 142 can be clamped around an outer shell 144 of a heat conduit 130, and a second outer shell 415 of the second heat conduit 410 can clamp around another portion 650 of the second heat pipe 635 and the portions 420 of the cooler 125 (e.g., micro-channel heat exchangers 150).

Figure 7:
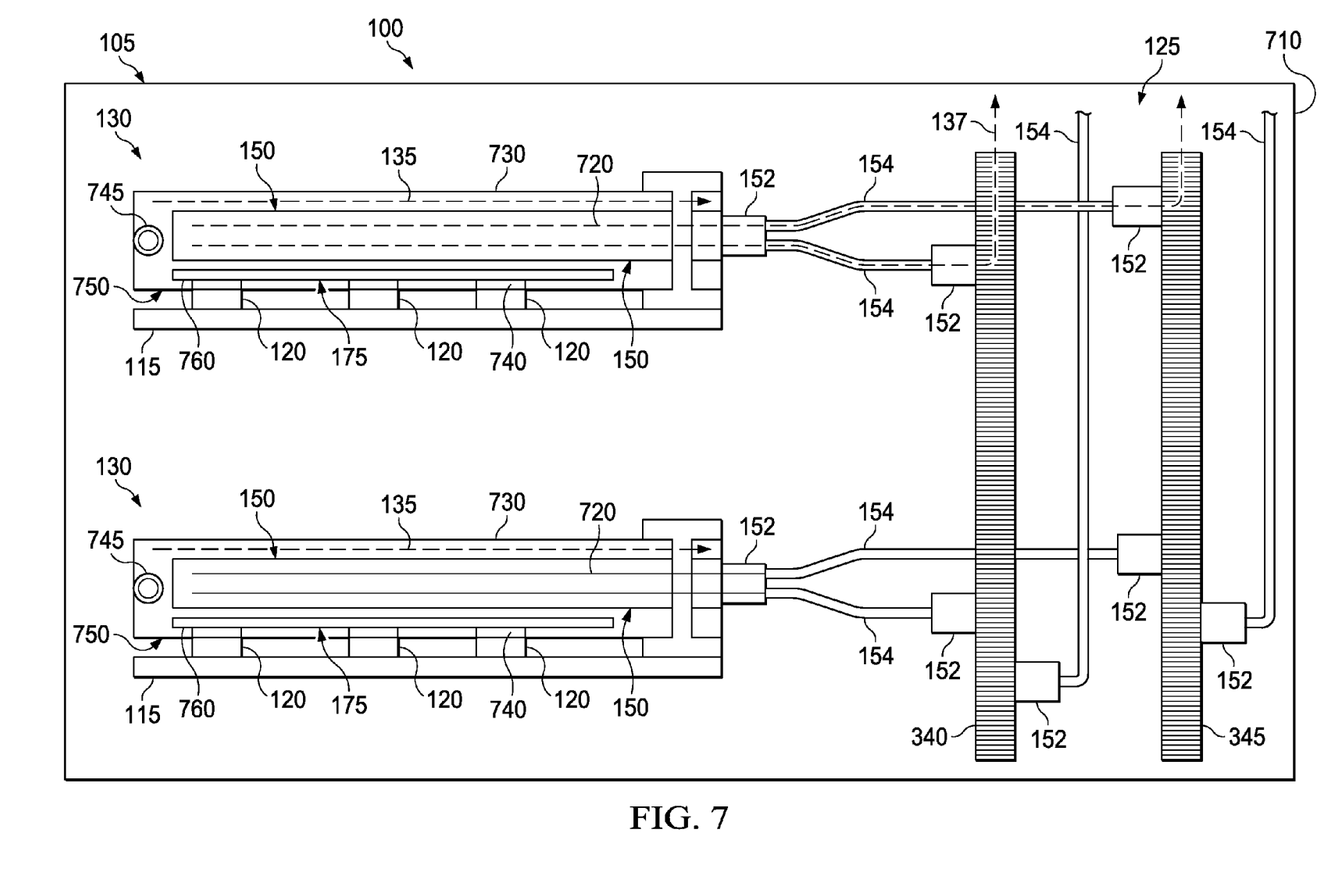
FIG. 7 presents a plan view of another example apparatus of the present disclosure.

In still other embodiments, the path 135 transporting the heat to the cooler 125 includes at least part of the cooling fluid circulation pathway 137. Such an embodiment is illustrated in FIG. 7, which presents a plan view of an alternative configuration of the example apparatus 100 of the present disclosure, analogous to the view presented in FIG. 1.

In the example embodiment, the apparatus 100 comprises the rack 105 (FIG. 1) having a row of electronics circuit boards 115, each circuit board 115 having one or more local heat sources 120. The apparatus 100 also comprises a cooler 125 located on a side of the rack 105 (e.g., a backside 710 in some cases) to circulate a cooling fluid therein. The apparatus 100 also comprises a plurality of channel segments 720 connected to receive cooling liquid from the cooler 125 and to transport the received cooling liquid back to the cooler 125 (e.g., via fluid lines 154 and cooling fluid inlet and outlet plenums 340, 345). The apparatus 100 further comprises a plurality of heat conduits 130. Each heat conduit 130 is removably clamped (e.g., using outer shell 730) around a corresponding one the channel segments 720 and has a portion adjacent a corresponding one of the circuit boards 115. Each heat conduit 130 has a localized thermal interface 740 with each of the local heat sources 120 of the corresponding one of the circuit boards 115.

In some embodiment the channel segments 720 are connected in parallel to a central portion (e.g., plenum portions 340, 345) of the cooler 125. Such as parallel connection can improve fluid flow rates. In other cases, however the channel segments 720 can be connected to each other in series, e.g., to facilitate reducing the numbers of connections that need to be made and thereby reduce the size of the apparatus as well as its manufacturing costs.

In some embodiments, each heat conduit 130 has a hinge 745 that enables unclamping of the heater spreader 130 from the corresponding one set of the channel segments 720. In some embodiments, each heat conduit 130 is compressibly clamped around the corresponding one set of the channel segments 720 to facilitate efficient thermal contact between these structures. In some cases, to facilitate heat transfer, a broader one of the surfaces 750 of each heat conduit 130 is located adjacent to a broader one of the surfaces 760 of the corresponding one of the local heat sources 120. In some embodiments, the channel segments 720 are part of a micro-channeled heat exchanger 150. In some cases, channel segments 720 and micro-channeled heat exchanger 150 can be part of the cooler 125. In other embodiments a heat spreader 175 such as shown in FIG. 7 is located between the channel segments and the corresponding one or more of the local heat sources 120. Such a configuration is advantageous as it can help to distribute the heat load more uniformly or evenly within and between channel segments. In some embodiments the heat spreader 175 is integrated with the heat conduit 130. In some embodiments the heat spreader 175 is integrated with the channel segments 720. In other embodiments the heat spreader 175 is separate from the heat conduit 130 and separate from the channel segments 720. In some embodiments a heat spreader 175 is located between a broader one of the surfaces of the heat conduit 130 and a broader one of the surfaces of the corresponding the local heat sources 120. E.g., the heat spreader 175 has a notion of broadness that substantially corresponds to the broadness of the contacted surfaces of the heat conduit 130 and the heat source 120.

Figure 8A:
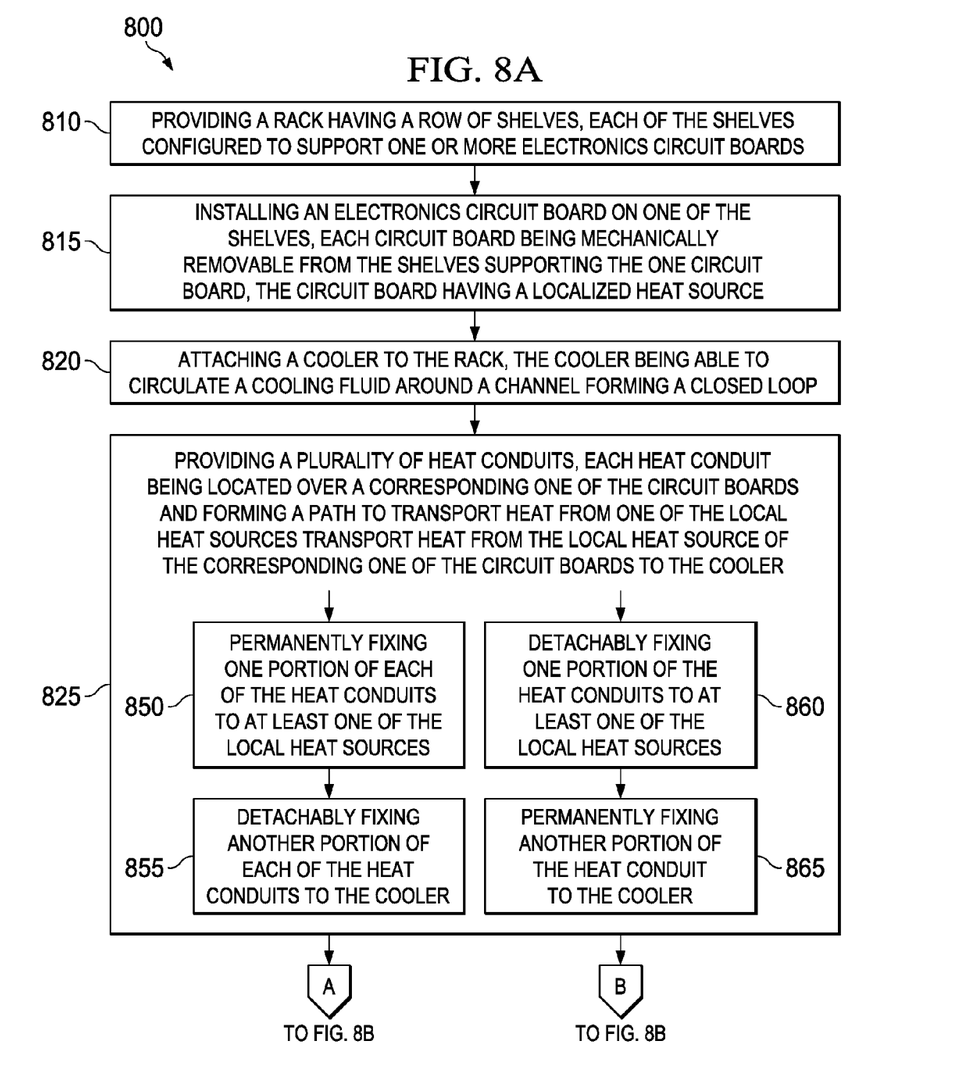
FIG. 8 presents a flow diagram illustrating an example method for assembling an apparatus of the disclosure e.g., the any of the example apparatuses of FIGS. 1-7.
Figure 8B:
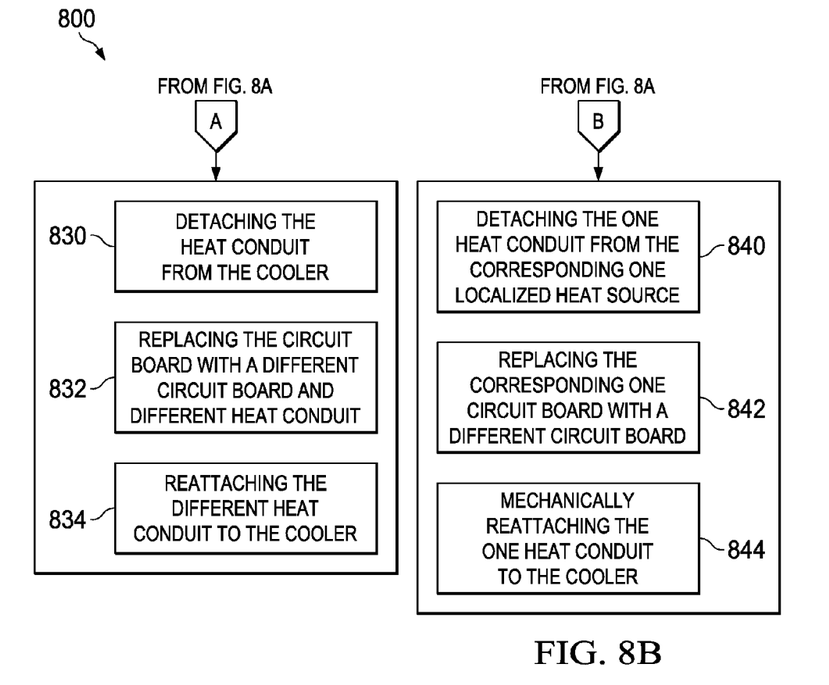

Another embodiment of the disclosure is a method of operating an apparatus. FIG. 8A-8B presents a flow diagram illustrating an example method 800 for assembling an apparatus of the disclosure. Any of the embodiments of the apparatus 100, and its component parts, discussed herein can be operated in accordance with the method 800.

With continuing reference to FIG. 1 throughout, as shown in FIG. 8A, the method 800 includes a step 810 of providing a rack 105 having a row of shelves 110, each of the shelves 110 configured to support one or more electronics circuit boards.

The method 800 also comprises a step 815 of installing an electronics circuit board 115 on one of the shelves, each circuit board 115 being mechanically removable from the shelve 110 supporting the one circuit board 115, the circuit board 115 having a localized heat source 120.

The method 800 further comprises a step 820 of attaching a cooler 125 to the rack 105, the cooler 125 being able to circulate a cooling fluid around a channel forming a closed loop.

The method also comprises a step 825 of providing a plurality of heat conduits 130, each heat conduit 130 being located over a corresponding one of the circuit boards 115 and forming a path 135 to transport heat from one of the local heat sources 130 transport heat from the local heat source 120 of the corresponding one of the circuit boards 115 to the cooler 125.

Each heat conduit 130 is configured to be mechanically detachable from the cooler 125, or, mechanically detachable from the electronic circuit board 115, without breaking the cooling fluid circulation pathway 137 through the cooler 125.

As noted above, in some embodiments, each heat conduit 130 can be constructed to not exchange cooling fluid with the cooler 125.

As shown in FIG. 8B, in some embodiments, for at least one of the heat conduits 130 that is fixed to a corresponding one of the heat sources 120 and detachably attached to the cooler 125, the method 800 can further include a step 830 of detaching the one heat conduit 130 from the cooler 125. The method 800 can further include a step 832 of replacing the corresponding one circuit board 115 with a different circuit board 115 and different heat conduit 130. The method 800 can further include a step 834 of reattaching the different heat conduit 130 to the cooler 125, thereby reforming the heat transfer path 135.

As shown in FIG. 8B, in some embodiments, for at least one of the heat conduits 130 that is fixed to the cooler 125 and detachably attached to a corresponding one of the circuit boards 115 of one of the circuit boards 115, the method 800 can further include a step 840 of detaching the one heat conduit 130 from the corresponding one circuit board 115. The method 800 can also comprise a step 842 of replacing the corresponding one circuit board 115 with a different circuit board 115, and a step 844 of reattaching the heat conduit 130 to the different circuit board 115.

As shown in FIG. 8A, In some embodiments of the method 800, providing the heat conduits 130 in step 825 includes a step 850 of permanently fixing one portion (e.g., the outer shell 144) of each of the heat conduits 130 to at least one of the local heat sources 120, and a step 855 of detachably fixing another portion (e.g., heat pipe 142) of each of the heat conduits 130 to the cooler 125.

For example, in some cases, permanently fixing the one portion in step 850 includes soldering the one portion of the heat conduits 130 to the at least one local heat source 120 (e.g., the outer shell 144), For example, the step 855 of detachably fixing the other portion of the heat conduit 130 includes detachably attaching a first part of a finned nested heat sink coupler 215 to the cooler 125, or detachably attaching a second part of the nested heat sink coupler 210 (e.g., the heat sink 142) to the other portion of the heat conduit 130, wherein the first part 215 and second parts 210 of the heat sink couplers are interleaved (FIG. 2).

In some embodiments of the method 800, providing the heat conduits 130 in step 825, includes a step 860 of detachably fixing (analogous to step 855) one portion of the heat conduits 130 to at least one of the local heat sources 120, and a step 865 of permanently fixing (analogous to step 850) another portion of the heat conduit 130 to the cooler 125. For example, the step 860 of detachably fixing the portion of the heat conduit 130 can includes attaching a first part of a finned nested heat sink coupler to the localized heat source 120, attaching a second part of the nested heat sink coupler to the portion of the heat conduit 130 (e.g., the outer shell 144), and interleaving the first part and second parts of the heat sink couplers together. In some cases, the detachable connection, e.g., when occurring exterior to the circuit board 115, can be located in the heat conduit 130 itself and could be accomplished using, e.g., quick-release couplings or valve couplings.

Although the present disclosure has been described in detail, those skilled in the art should understand that they can make various changes, substitutions and alterations herein without departing from the scope of the invention.

What is claimed is:

1. An apparatus, comprising:
   a rack having a row of shelves, each shelf supporting an electronics circuit board, each one of the circuit boards being manually removable from the shelve supporting the one of the circuit boards and having a local heat source thereon;
   a cooler attached to the rack and being able to circulate a cooling fluid around a channel forming a closed loop; and
   a plurality of heat conduits, each heat conduit being located over a corresponding one of the circuit boards and forming a path to transport heat from the local heat source of the corresponding one of the circuit boards to the cooler; and
   wherein each heat conduit is configured to be manually detachable from the cooler or the circuit board, without breaking a circulation pathway of the fluid through the cooler, and
   wherein one of the heat conduits has a hinge and an outer shell, and the outer shell of the one heat conduit is removably clamped around a portion of a heat pipe of the heat conduit.

2. The apparatus of claim 1, wherein each heat conduit is constructed to not exchange the cooling fluid with the cooler.

3. The apparatus of claim 1, wherein one of the heat conduits is configured to transport heat to a localized thermal interface of the cooler.

4. The apparatus of claim 1, wherein one of the heat conduits contacts a micro-channeled heat exchanger of the cooler.

5. The apparatus of claim 4, wherein the one of the heat conduits and the localized thermal interface form a structure having interleaved metal fins, and the one of the heat conduits is manually detachable from the localized thermal interface.

6. The apparatus of claim 1, wherein another portion of the heat pipe is mechanically attached to the cooler.

7. An apparatus, comprising:
   a rack having a row of shelves, each shelf supporting an electronics circuit board, each one of the circuit boards being manually removable from the shelve supporting the one of the circuit boards and having a local heat source thereon;

a cooler attached to the rack and being able to circulate a cooling fluid around a channel forming a closed loop; and a plurality of heat conduits, each heat conduit being located over a corresponding one of the circuit boards and forming a path to transport heat from the local heat source of the corresponding one of the circuit boards to the cooler; and wherein each heat conduit is configured to be manually detachable from the cooler or the circuit board, without breaking a circulation pathway of the fluid through the cooler, and wherein one of the heat conduits has a hinge and an outer shell, and the outer shell of the one heat conduit is removably clamped around a portion of the channel.

8. An apparatus, comprising:

a rack having a row of electronics circuit boards, each circuit board having a corresponding local heat source thereon;

a cooler located on a side of the rack, the cooler configured to circulate a cooling fluid in a channel having a plurality of channel segments;

a plurality of heat conduits; and wherein each heat conduit is removably clamped around corresponding one of the channel segments and has a portion adjacent to the localized heat source on a corresponding one of the circuit boards.

9. The apparatus of claim 8, wherein the channel segments are connected in parallel to a central portion of the cooler.

10. The apparatus of claim 8, wherein the channel segments are connected to each other in series.

11. The apparatus of claim 8, wherein each heat conduit has a hinge that enables unclamping of the heater conduit from the corresponding one set of the channel segments.

12. The apparatus of claim 8, wherein each heat conduit is compressibly clamped around the corresponding one set of the channel segments.

13. The apparatus of claim 8, wherein a broader one of the surfaces of each heat conduit is located adjacent to a broader one of the surfaces of the corresponding one of the local heat sources.

14. A method of assembling an apparatus, comprising:

providing a rack having a row of shelves, each shelf supporting an electronics circuit board;

installing an electronics circuit board on one of the shelves, each one of the circuit boards being mechanically removable from the shelve supporting the one of the circuit boards and having a local heat source;

attaching a cooler to the rack, the cooler being able to circulate a cooling fluid around a channel forming a closed loop; and providing a plurality of heat conduits, each heat conduit being located over a corresponding one of the circuit boards and forming a path to transport heat from the local heat source of the corresponding one of the circuit boards to the cooler; and wherein each heat conduit is configured to be manually detachable from the cooler or the circuit board, without breaking a circulation pathway of the fluid through the cooler and wherein one of the heat conduits has a hinge and an outer shell, and the outer shell of the one heat conduit is removably clamped around a portion of a heat pipe the heat conduit.

15. The method of claim 14, wherein each heat conduit is constructed to not exchange cooling fluid with the cooler.

16. The method of claim 14, further including:

detaching one of the heat conduits from the cooler;

replacing one of the circuit boards and corresponding heat conduit with a different circuit board and different heat conduit; and reattaching the different heat conduit to the cooler.

17. The method of claim 14, further including:

detaching one of the heat conduits from the corresponding circuit board;

replacing the corresponding circuit board with a different circuit board; and reattaching the heat conduit to the different circuit board.

18. The method of claim 14, where providing the heat conduits includes permanently fixing one portion of one of the heat conduits to one of the local heat sources, and detachably fixing another portion of the heat conduit to the cooler.

19. The method of claim 18, wherein the mechanically detachable connection between the heat conduit and the cooler includes finned heat sink couplers.

20. The method of claim 14, wherein providing the heat conduits includes detachably fixing one portion of the heat conduits to one of the local heat sources, and permanently fixing another portion of the heat conduit to the cooler.

* * * * *